(12) United States Patent
Liao et al.

(10) Patent No.: US 12,538,847 B2
(45) Date of Patent: Jan. 27, 2026

(54) PACKAGE STRUCTURE AND MANUFACTURING METHOD THEREOF

(71) Applicant: POWERTECH TECHNOLOGY INC., Hsinchu County (TW)

(72) Inventors: Ching-Wei Liao, Hsinchu County (TW); Shang-Yu Chang Chien, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 378 days.

(21) Appl. No.: 18/204,956

(22) Filed: Jun. 2, 2023

(65) Prior Publication Data

US 2024/0030198 A1    Jan. 25, 2024

(30) Foreign Application Priority Data

Jul. 21, 2022  (TW) .................................. 111127359

(51) Int. Cl.
  *H01L 25/10*  (2006.01)
  *H01L 21/56*  (2006.01)
  *H01L 23/00*  (2006.01)

(52) U.S. Cl.
  CPC .......... *H01L 25/105* (2013.01); *H01L 21/568* (2013.01); *H01L 24/20* (2013.01);
  (Continued)

(58) Field of Classification Search
  CPC ..... H01L 25/105; H01L 21/568; H01L 24/20; H01L 24/32; H01L 21/561; H01L 24/19; H01L 24/83; H01L 24/96; H01L 2224/19; H01L 2224/214; H01L 2224/32225; H01L 2224/83005; H01L 2224/96; H01L 2225/1035; H01L 2225/1058; H01L 2924/01028; H01L 2924/01029; H01L 2924/01047; H01L 2924/0105; H01L 23/49816; H01L 23/5389; H01L 23/3128; H01L 2221/68345; H01L 2221/68359; H01L 21/6835
  (Continued)

(56) References Cited

U.S. PATENT DOCUMENTS 9,449,953 B1 *  9/2016  Shih .................... H01L 23/5389
9,553,059 B2 *  1/2017  Tsai ....................... H01L 21/565
  (Continued)

FOREIGN PATENT DOCUMENTS

TW   200820374        5/2008
TW   201230281 A1     7/2012
  (Continued)

*Primary Examiner* — Vu A Vu
(74) *Attorney, Agent, or Firm* — Winston Hsu

(57) ABSTRACT

A package structure and a manufacturing method thereof are provided. The package structure includes a redistribution layer, a conductive element, an active chip, an encapsulation layer, another redistribution layer, and a conductive terminal. The conductive element, the active chip, and the encapsulation layer are disposed on the redistribution layer and the encapsulation layer surrounds the conductive element and the active chip. The another redistribution layer is disposed on the conductive element, the active chip and the encapsulation layer and electrically connected to the redistribution layer through the conductive element.

20 Claims, 9 Drawing Sheets

(52) U.S. Cl.
 CPC ............ *H01L 24/32* (2013.01); *H01L 21/561* (2013.01); *H01L 24/19* (2013.01); *H01L 24/83* (2013.01); *H01L 24/96* (2013.01); *H01L 2224/19* (2013.01); *H01L 2224/214* (2013.01); *H01L 2224/32225* (2013.01); *H01L 2224/83005* (2013.01); *H01L 2224/96* (2013.01); *H01L 2225/1035* (2013.01); *H01L 2225/1058* (2013.01); *H01L 2924/01028* (2013.01); *H01L 2924/01029* (2013.01); *H01L 2924/01047* (2013.01); *H01L 2924/0105* (2013.01)

(58) Field of Classification Search
 USPC ........................................................ 257/737
 See application file for complete search history.

(56) References Cited

U.S. PATENT DOCUMENTS

| | | | | |
|---|---|---|---|---|
| 10,037,975 | B2 * | 7/2018 | Hsieh | H01L 23/28 |
| 10,510,645 | B2 * | 12/2019 | Wang | H01L 23/5226 |
| 10,515,827 | B2 * | 12/2019 | Jeng | H01L 23/49822 |
| 11,393,795 | B2 * | 7/2022 | Park | H01L 25/0652 |
| 12,347,785 | B2 * | 7/2025 | Yu | H01L 24/20 |
| 2022/0028773 | A1 * | 1/2022 | Lu | H01L 25/03 |
| 2022/0375829 | A1 * | 11/2022 | Hwang | H01L 23/49833 |
| 2023/0065366 | A1 * | 3/2023 | Kim | H01L 23/3135 |

FOREIGN PATENT DOCUMENTS

| | | | |
|---|---|---|---|
| TW | 201822310 | A | 6/2018 |
| TW | 201906124 | A | 2/2019 |
| TW | 202209588 | A | 3/2022 |

\* cited by examiner

PACKAGE STRUCTURE AND MANUFACTURING METHOD THEREOF

BACKGROUND OF THE INVENTION

1. Field of the Invention

The present invention relates to a package structure and a manufacturing method thereof, and particularly to a package structure having an active chip disposed between two redistribution layer and a manufacturing method thereof.

2. Description of the Prior Art

With the advancement of semiconductor technology, circuit density in a chip tends to be higher so as to improve operation performance and reduce a size of the chip. In conventional chip design, a thickness of the chip is usually increased to facilitate heat dissipation of the chip. Accordingly, when the chip is packaged, heights of conductive pillars need to be increased, such that the heights of the conductive pillars are greater than the thickness of the chip. However, as the thickness of the photoresist layer used for forming the conductive pillars is higher, apertures of through holes are greater, which limits distribution density of the conductive pillars. Also, since the thickness of the photoresist layer is limited, the heights of the conductive pillars are unable to be continuously increased, thereby limiting the thickness of the chip capable of being packaged. As a result, to solve the issue that the thickness of the chip is limited is an objective for the person in the related art.

SUMMARY OF THE INVENTION

An embodiment of the present invention provides a package structure including a redistribution layer, a conductive element, an active chip, an encapsulation layer, another redistribution layer, and a conductive terminal. The conductive element and the active chip are disposed on the redistribution layer side by side, and the encapsulation layer is disposed on the redistribution layer and surrounds the conductive element and the active chip. The another redistribution layer is disposed on the conductive element, the active chip and the encapsulation layer and is electrically connected to the redistribution layer through the conductive element. The another redistribution layer includes a conductive layer and a dielectric layer, the dielectric layer has a first surface close to the active chip and a second surface away from the active chip, the dielectric layer is disposed on the conductive layer and has a through hole, the conductive layer includes a bonding pad disposed in the through hole, and a width of the through hole gradually increases from the second surface of the dielectric layer to the first surface of the dielectric layer. The conductive terminal is disposed on the bonding pad and contacts the bonding pad through the through hole.

Another embodiment of the present invention provides a manufacturing method of a package structure. First, a redistribution layer is formed on a carrier, in which the redistribution layer includes a dielectric layer and a conductive layer sequentially formed on the carrier, the dielectric layer has a first surface away from the carrier, a second surface close to the carrier, and a through hole, the conductive layer includes a bonding pad disposed in the through hole, and a width of the through hole gradually increases from the second surface of the dielectric layer to the first surface of the dielectric layer. Next, a conductive element, an active chip, and an encapsulation layer are formed on the redistribution layer, in which the encapsulation layer surrounds the conductive element and the active chip. Then, another redistribution layer is formed on the conductive element, the active chip, and the encapsulation layer. Thereafter, the carrier is removed to expose the bonding pad. Then, a conductive terminal is disposed on an exposed surface of the bonding pad, in which the conductive terminal contacts the bonding pad through the through hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
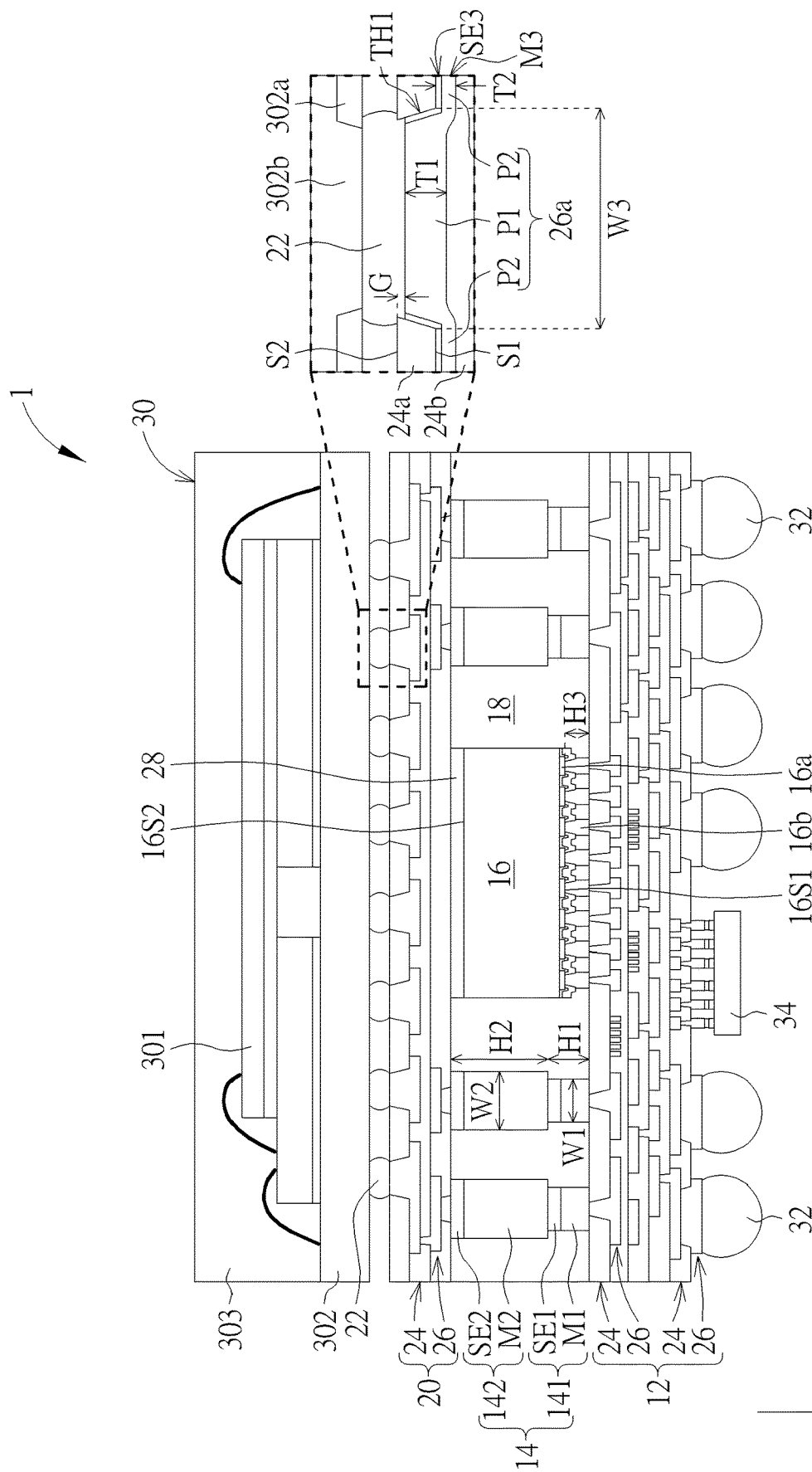
FIG. 1 is a schematic cross-sectional view of a package structure according to an embodiment of the present invention.

The contents of the present invention will be described in detail with reference to specific embodiments and drawings. It is noted that, for purposes of illustrative clarity and being easily understood by the readers, the following drawings may be simplified schematic diagrams, and components therein may not be drawn to scale. The numbers and sizes of the components in the drawings are just illustrative and are not intended to limit the scope of the present invention.

Spatially relative orientation terms, such as "above", "on", "beneath", "below", "under", "left", "right", "before", "front", "after", "behind" and the like, used in the following embodiments just refer to the directions in the drawings and are not intended to limit the present invention. It may be understood that components in the drawings may be disposed in any kind of formation known by those skilled in the related art to describe or illustrate the components in a certain way.

When one component or layer is "on" or "above" another component or layer, it may be understood that the component or layer is directly on the another component or layer, and alternatively, another component or layer may be between the one component or layer and the another component or layer (indirectly). On the contrary, when the component or layer is "directly on" the another component or layer, there is no intervening component or layer between the component or layer and the another component or layer.

As disclosed herein, when one component is referred to as being "electrically connected to" or "coupled to" another component, it will be understood that intervening components may be between the component and the another component and electrically connect the component to the another component, and alternatively, the component may be directly electrically connected to the another component without intervening components existing between them. If one component is referred to as being "directly electrically connected to" or "directly coupled to" another component, there are no intervening components present between them.

Please refer to FIG. 1, which is a schematic cross-sectional view of a package structure according to an embodiment of the present invention. As shown in FIG. 1, the package structure 1 provided in this embodiment may include a redistribution layer 12, a plurality of conductive elements 14, an active chip 16, an encapsulation layer 18, a redistribution layer 20, and at least one conductive terminal 22. The conductive elements 14, the active chip 16 and the encapsulation layer 18 may be disposed on the redistribution layer 12, and the encapsulation layer 18 may surround the conductive elements 14 and the active chip 16. In addition, the redistribution layer 20 is disposed on the conductive elements 14, the active chip 16, and the encapsulation layer 18, and the redistribution layer 20 is electrically connected to the redistribution layer 12 through the conductive elements 14.

Specifically, each of the redistribution layer 12 and the redistribution layer 20 may include at least one dielectric layer 24 and at least one conductive layer 26. In this embodiment, each of the redistribution layer 12 and the redistribution layer 20 may include a plurality of dielectric layers 24 and a plurality of conductive layers 26, but not limited thereto. In some embodiments, the number of conductive layers and the number of dielectric layers in the redistribution layer 12 and the redistribution layer 20 may be adjusted according to requirements.

In the redistribution layer 12 and the redistribution layer 20, the dielectric layers 24 and the conductive layers 26 are alternately stacked in sequence, so as to electrically connect component(s) located on the redistribution layer 12 (or the redistribution layer 20) to component(s) located under the redistribution layer 12 (or the redistribution layer 20). Each dielectric layer 24 may have at least one through hole, so that the conductive layers 26 adjacent to one of the dielectric layers 24 and located on both sides of the one of the dielectric layers 24 may be electrically connected through the through hole. Accordingly, the lowermost conductive layer 26 may be electrically connected to the uppermost conductive layer 26. Each conductive layer 26 may include at least one trace or bonding pad, and a layout structure of the trace may be designed according to the requirements. In addition, a distance between two adjacent traces or bonding pads in any conductive layer 26 may also be adjusted to be different from or the same as a distance between two adjacent traces or bonding pads in another conductive layer 26 according to requirements. For example, a pitch (e.g., a fine pitch) between two adjacent bonding pads of the uppermost conductive layer 26 may be less than a pitch between two adjacent bonding pads of the lowermost conductive layer 26, so as to achieve a fan-out performance, but not limited thereto.

Figure 4:
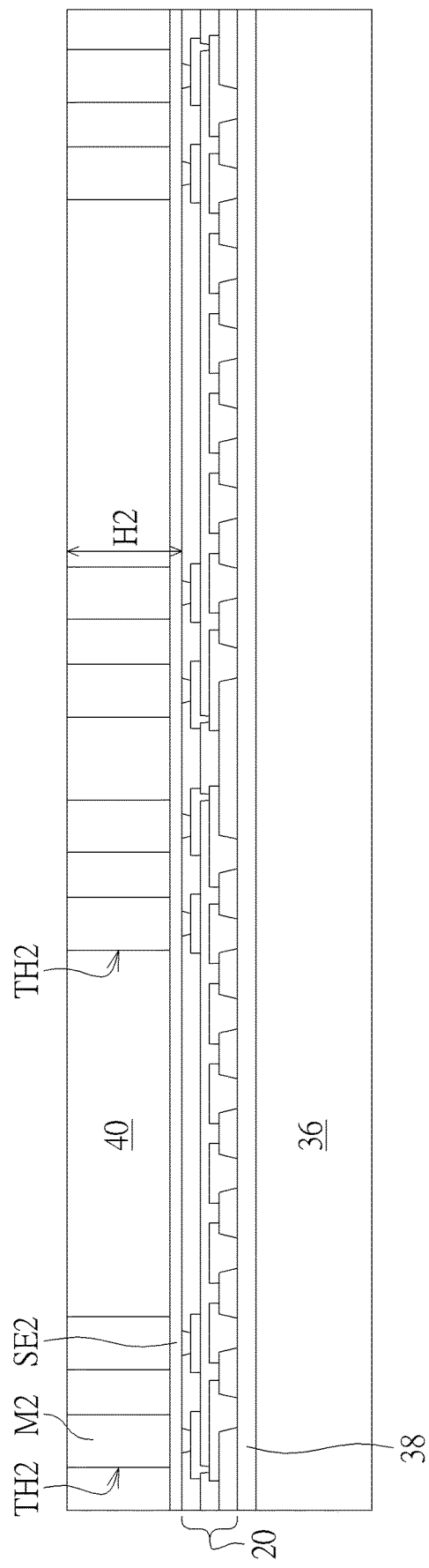

As shown in FIG. 1, each of the conductive elements 14 may, for example, include a plurality of conductive pillars stacked on the redistribution layer 12. Since a manner of forming a single layer of the conductive pillars is to form a patterned photoresist layer with a plurality of through holes and then form the conductive pillars in the through holes (as shown in FIG. 4), a height of the single layer of the conductive pillars is limited by the patterned photoresist layer. In this embodiment, the stacking structure of multiple layers of the conductive pillars may allow a thickness of the active chip 16 in the package structure 1 to be greater than or equal to 200 micrometers (μm), thereby solving the issue of the limited thickness of the active chip 16. For example, at least one of the conductive elements 14 may include at least two conductive pillars 141 and 142 sequentially stacked on the redistribution layer 20. Also, a height H1 of the conductive pillar 141 may be less than a height H2 of the conductive pillar 142, and a width W1 of the conductive pillar 141 may be less than a width W2 of the conductive pillar 142. In some embodiments, the conductive pillar 141 may include a metal layer M1 and a seed layer SE1, and the seed layer SE1 may be disposed between the metal layer M1 and the conductive pillar 142, but not limited thereto. The conductive pillar 142 may include a metal layer M2 and a seed layer SE2, and the seed layer SE2 may be disposed between the metal layer M2 and the redistribution layer 20. The seed layer SE1 and the seed layer SE2 may facilitate the formation of the metal layer M1 and the formation of the metal layer M2, respectively. The seed layer SE1, the seed layer SE2, the metal layer M1 and the metal layer M2 may, for example, include copper, titanium (T1), nickel (Ni), gold (Au) or other suitable materials. In some embodiments, the conductive pillar 141 and/or other conductive pillar on the conductive pillar 141 may not include the seed layer SE1 and may be formed of the metal layer M1, such that the metal layer M1 may be in direct contact with the metal layer M2 of the conductive pillar 142, but not limited thereto.

As shown in FIG. 1, the active chip 16 may include a plurality of input/output pads 16a and a plurality of conductive bumps 16b, in which the conductive bumps 16b are respectively disposed on the input/output pads 16a. A surface of the active chip 16 with the input/output pads 16a may for example be referred to as an active surface 16S1. In some embodiments, a distance between the active surface 16S1 of the active chip 16 and the redistribution layer 12 may be, for example, less than a height H1 of the conductive pillar 141. In other words, a height H3 of one of the conductive bumps 16b may be less than the height H1 of the conductive pillar 141, but not limited thereto. In the embodiment of FIG. 1, the active surface 16S1 of the active chip 16 may face the redistribution layer 12, so that the active chip 16 may be electrically connected to the redistribution layer 20 through the redistribution layer 12 and the conductive elements 14. In such case, the package structure 1 may further include an adhesive layer 28 for attaching a back surface 16S2 of the active chip 16 opposite to the active surface 16S1 on the redistribution layer 20, but the present invention is not limited thereto. The adhesive layer 28 may include, for example, a die attach film (DAF), double-sided tape, or other suitable materials. In some embodiments, the active surface 16S1 of the active chip 16 may face the redistribution layer 20.

As used herein, the active chip 16 may refer to a chip that includes an active component. The active component may include a transistor, a diode, an integrated circuit, an opto-electronic component, or other suitable components with gain. Herein, the chip may be referred to as a die, but not limited thereto. The active chip 16 may include, for example, a power management integrated circuit (PMIC), a micro-electro-mechanical-system (MEMS) chip, an application-specific integrated circuit (ASIC), a dynamic random access memory (DRAM) chip, a static random access memory (SRAM) chip, a high bandwidth memory (HBM) chip, system on chip (SoC), a high performance computing (HPC) chip or other similar active chips, but not limited thereto. The conductive bumps 16b may include, for example, a multi-layer structure. The conductive bumps 16b may include, for example, copper, nickel, tin, silver, other suitable materials, alloys of at least two thereof, or a combination thereof.

As shown in FIG. 1, the encapsulation layer 18 may be disposed between adjacent two of the conductive elements 14 and between the conductive elements 14 and the active chip 16. In some embodiments, the encapsulation layer 18 may be disposed between the active chip 16 and the redistribution layer 12. The encapsulation layer 18 may include, for example, a molding compound or other suitable encapsulation materials.

As shown in an enlarged view in a right part of FIG. 1, in the redistribution layer 20, a dielectric layer 24a may be disposed on a conductive layer 26a and have at least one through hole TH1, and the dielectric layer 24a may have a first surface S1 close to the active chip 16 and a second surface S2 away from the active chip 16. The conductive layer 26a may include at least one bonding pad P1, and the bonding pad P1 may be disposed in the through hole TH1. For example, in an orientation shown in FIG. 1, the dielectric layer 24a may be the uppermost one of the dielectric layers 24 in the redistribution layer 20, and the conductive layer 26a may be the uppermost one of the conductive layers 26 in the redistribution layer 20, so that the bonding pad P1 may be exposed from an upper surface of the redistribution layer 20 (e.g., exposed from the second surface S2 of the dielectric layer 24a) so as to be used for being electrically connected to components on the redistribution layer 20. In this embodiment, the number of the bonding pads P1 may be plural, but not limited thereto.

In this embodiment, the conductive layer 26a may further include at least one trace P2 located on the first surface S1 of the dielectric layer 24a, and a thickness T1 of one of the bonding pads P1 may be greater than a thickness T2 of the trace P2. The thickness T2 of the trace P2 may be, for example, greater than or equal to 4 μm, preferably 5 μm to 7 μm. The trace P2 may be used to electrically connect the one of the bonding pads P1 to other traces of other conductive layers 26 or other bonding pads P1. The trace P2 and the bonding pads P1 may be formed of, for example, the same conductive layer 26a. The trace P2 and the one of the bonding pads P1 may be connected to each other to form a continuous structure formed of the same conductive layer 26a, so that the conductive layer 26a may extend from the through hole TH1 to the first surface S1 of the dielectric layer 24a, but not limited thereto. For example, in FIG. 1, in a top view direction TD1 of the package structure 1, the one of the bonding pads P1 may be a portion of the conductive layer 26a overlapping the through hole TH1, and the trace P2 may be a portion of the conductive layer 26a that does not overlap the through hole TH1, but not limited thereto.

As shown in FIG. 1, the bonding pads P1 and the trace P2 of the conductive layer 26a may include a seed layer SE3 and a metal layer M3 stacked in sequence, and the metal layer M3 may be separated from the dielectric layer 24a through the seed layer SE3. The metal layer M3 may, for example, include copper or other suitable materials. The seed layer SE3 may, for example, include copper, titanium, or other suitable materials.

Figure 3:
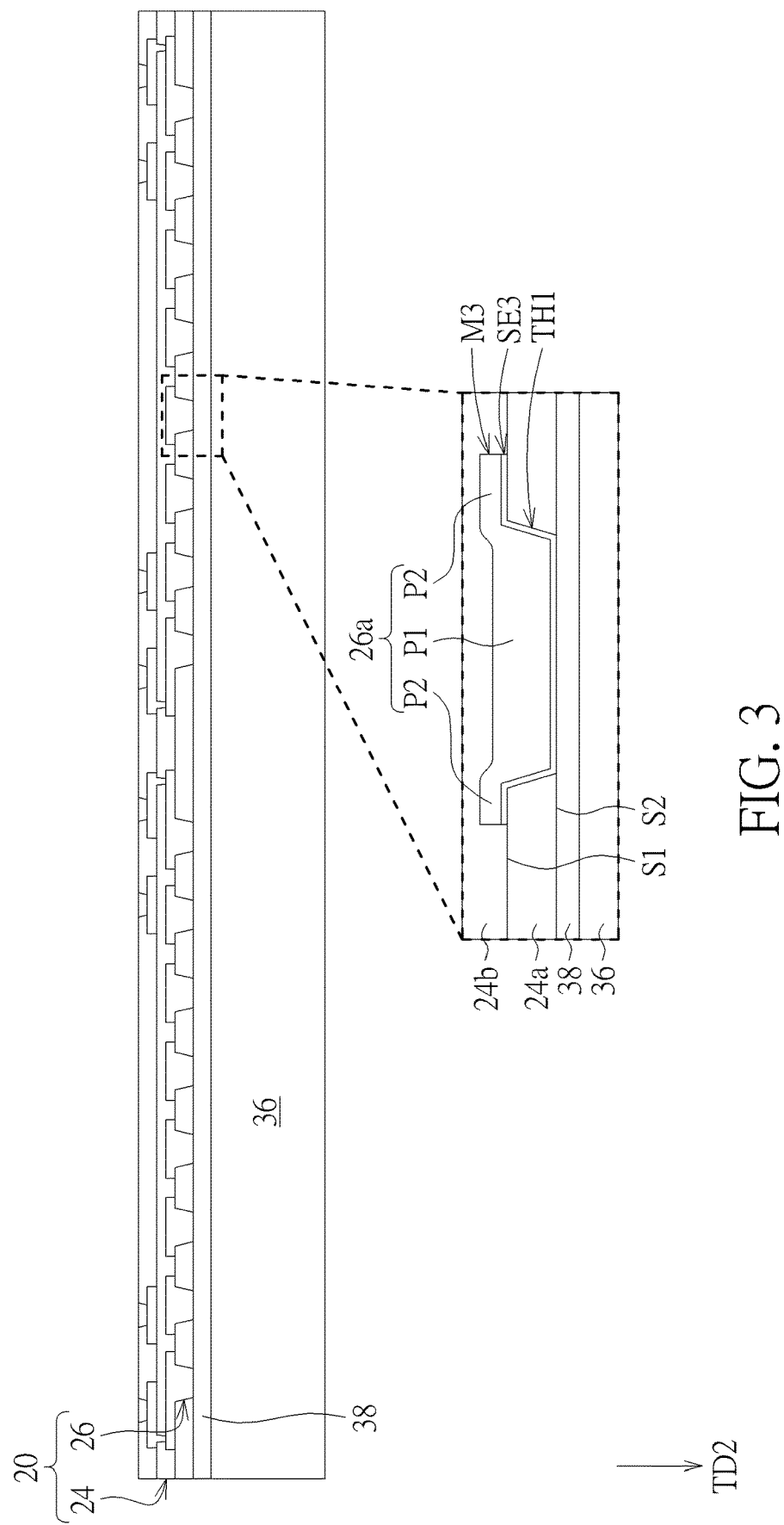
FIG. 3 to FIG. 9 schematically illustrate structures in different steps of the manufacturing method according to an embodiment of the present invention.

It should be noted that, in this embodiment, the dielectric layer 24a may be formed on a carrier (e.g., a carrier 36 shown in FIG. 3) first, and then the through hole TH1 is formed in the dielectric layer 24a. After that, the bonding pad P1 is formed in through hole TH1, and the trace P2 is formed on the first surface S1 of the dielectric layer 24a (as shown in FIG. 3), so that a width W3 of the through hole TH1 gradually increases from the second surface S2 to the first surface S1 of the dielectric layer 24a. For example, in a horizontal direction perpendicular to the top view direction TD1, the through hole TH1 may have a trapezoidal cross-sectional shape. Furthermore, as shown in the enlarged view in the right part of FIG. 1, a gap G is between a plane of the second surface S2 of the dielectric layer 24a and a plane of the upper surface of one of the bonding pads P1 in the top direction TD1 of the package structure 1. The gap G may be formed, for example, by removing an exposed portion of the seed layer SE3.

As shown in FIG. 1, the conductive terminal 22 may be disposed on the bonding pad P1. The conductive terminal 22 may, for example, include solder ball or other suitable materials. In this embodiment, the number of the conductive terminal 22 may be the same as the number of the bonding pads P1 and for example be plural, but not limited thereto. In such case, the conductive terminals 22 may respectively contact the corresponding bonding pads P1 through the corresponding through holes TH1. In other words, a portion of one of the conductive terminals 22 may be disposed in the gap G to facilitate positioning or anchoring of this conductive terminal 22 on the corresponding bonding pad P1. For example, the metal layer M3 of the bonding pad P1 may be in contact with this conductive terminal 22.

It is noted that conventional bonding pads are generally formed on the carrier before the dielectric layers are formed and followed by forming the dielectric layers and traces in sequence, so that the conventional bonding pads and the conventional traces are formed of different conductive layers, respectively. Namely, a seed layer, a metal layer, another seed layer, and another metal layer need to be formed in sequence, which reduces production efficiency. However, in this embodiment, since the trace P2 and the bonding pad P1 are formed of the same conductive layer 26a, one seed layer and one metal layer may be saved compared to the structure of the conventional bonding pads and traces, and no discontinuous interface exists between the trace P2 and the bonding pad P1. Accordingly, the number of the conductive layers 26 of the redistribution layer 20 may be reduced to shrink a thickness of the redistribution layer 20, thereby saving fabrication time. In addition, through forming the trace P2 and the bonding pads P1 by the same conductive layer 26a, flatness of a surface of the conductive layer 26a close to the active chip 16 and flatness of the surfaces of other dielectric layers 24 (that are formed after the conductive layer 26a and the dielectric layer 24a) close to the active chip 16 may be improved in comparison to the conventional process for forming the bonding pads, the dielectric layers and the traces, so as to improve production efficiency of the redistribution layer 20, especially improving the production efficiency when the redistribution layer 20 has the fine pitch. Furthermore, since the thickness of one of the bonding pads P1 may be greater than that of the conventional bonding pad, after the conductive terminals 22 are disposed on the bonding pads P1, a whole of the metal layer M3 may be reduced or prevented from completely reacting with the conductive terminal 22 to form an intermetallic compound (intermetallic compound, IMC). Accordingly, the bonding reliability between the bonding pad P1 and the conductive terminal 22 may be improved.

In this embodiment, the redistribution layer 20 may further include a dielectric layer 24b adjacent to the dielectric layer 24a, and the trace P2 is located between the dielectric layer 24b and a plane of a surface of the dielectric layer 24a in contact with the dielectric layer 24b (i.e., the first surface S1), but not limited thereto. The top view direction TD1 may be, for example, a direction perpendicular to the back surface 16S2 of the active chip 16, but not limited thereto.

In this embodiment, the package structure 1 may further include at least one package component 30 disposed on the conductive terminals 22 and electrically connected to the redistribution layer through the conductive terminals 22, and the package component may be bonded to the redistribution layer 20 by the conductive terminals 22. The package component 30 may, for example, include at least one chip 301, a circuit layer 302, an encapsulation layer 303 and/or other suitable components, in which the encapsulation layer 303 may, for example, seal the chip 301 on the circuit layer 302, and the chip 301 may be electrically connected to the conductive terminals 22 through the circuit layer 302 so as to be electrically connected to the redistribution layer 20. As shown in the enlarged view in the right part of FIG. 1, the circuit layer 302 may include a dielectric layer 302a and a conductive layer 302b, and the lowermost conductive layer 302b may be in contact with one of the conductive terminals 22. The circuit layer 302 may include, for example, a redistribution layer, a circuit board, or other layers or substrates with wiring. The package component 30 of the present invention is not limited to the mentioned above and may be any type or kind of component.

As shown in FIG. 1, the package structure 1 may further include a plurality of conductive terminals 32 disposed on a side of the redistribution layer 12 away from the active chip 16 and electrically connected to the redistribution layer 12. The conductive terminals 32 may, for example, include solder balls or other suitable materials. In this embodiment, the package structure 1 may optionally further include an electronic component 34 disposed on the side of the redistribution layer 12 away from the active chip 16 and electrically connected to the redistribution layer 12. For example, the electronic component 34 may be a chip that includes an active component and/or passive component.

Figure 2:
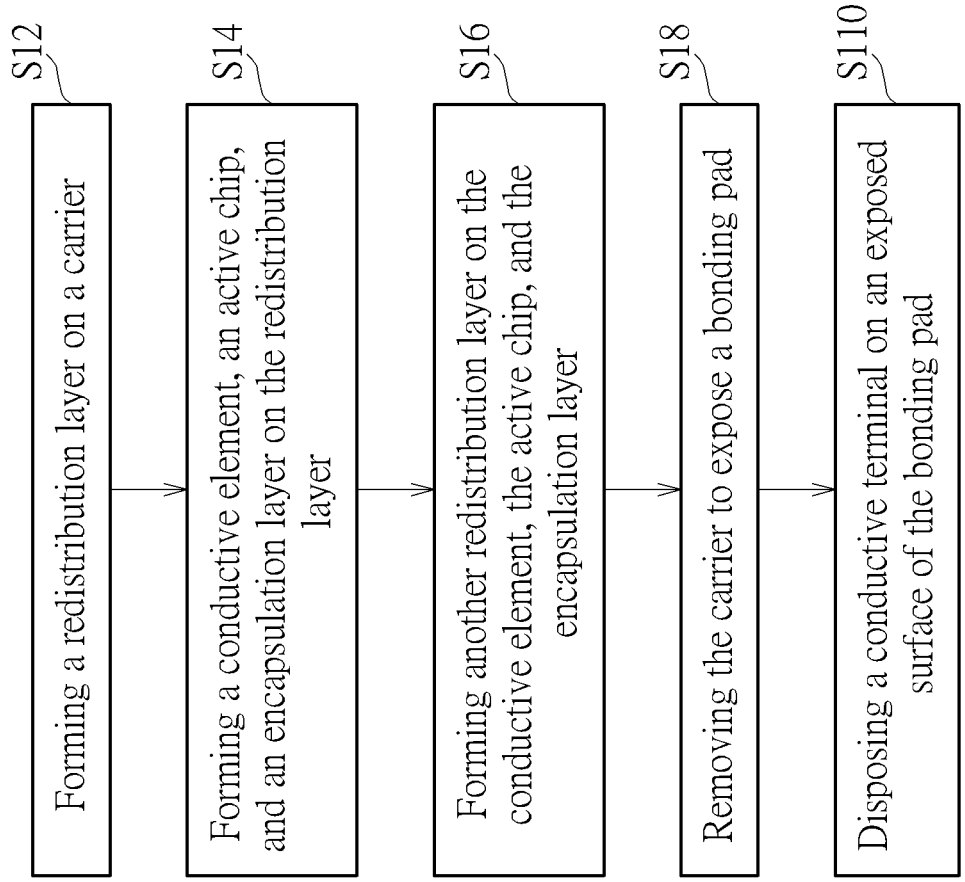
FIG. 2 schematically illustrates a flowchart of a manufacturing method of a package structure according to an embodiment of the present invention.

Please refer to FIG. 2 to FIG. 9. FIG. 2 schematically illustrates a flowchart of a manufacturing method of a package structure according to an embodiment of the present invention, and FIG. 3 to FIG. 9 schematically illustrate structures in different steps of the manufacturing method according to an embodiment of the present invention. As shown in FIG. 2, the manufacturing method provided by this embodiment may include, for example, step S12 to step S110 performed in sequence and are described in detail below with reference to FIG. 1 and FIG. 3 to FIG. 9. In some embodiments, another step may be performed before or after step S12 to step S110, between any two of step S12 to step S110, or while performing any one of step S12 to step S110.

As shown in FIG. 3, in step S12, a carrier 36 is provided first. Then, the redistribution layer 20 is formed on the carrier 36. A manner of forming the redistribution layer 20 may be, for example, to alternately form the dielectric layers 24 and the conductive layers 26. Specifically, the dielectric layer 24a may be formed on the carrier 36 first, and the through hole TH1 may be formed in the dielectric layer 24a. The dielectric layer 24a may have the first surface S1 away from the carrier 36 and the second surface S2 close to the carrier 36, and the width of the through hole TH1 increases gradually from the second surface S2 to the first surface S1. Then, the conductive layer 26a is formed on the dielectric layer 24a and in the through hole TH1. The conductive layer 26a may be formed, for example, by a following method, but not limited thereto. First, the seed layer SE3 is formed on the dielectric layer 24a and the carrier 36, and then a patterned photoresist layer (not shown) is formed on the seed layer SE3, in which the patterned photoresist layer has through holes exposing the seed layer SE3. Then, the metal layer M3 is formed on the exposed seed layer SE3. Following that, the patterned photoresist layer is removed to expose the seed layer SE3 that does not overlap the metal layer M3 in the top view direction TD2. A manner of forming the metal layer M3 may include, for example, an electroplating process or other suitable methods. Subsequently, the exposed seed layer SE3 which is not covered by the metal layer M3 is removed, thereby forming the conductive layer 26a. In the orientation shown in FIG. 3, since the conductive layer 26a is the lowest conductive layer 26 in the redistribution layer 20, the conductive layer 26a may form the bonding pad P1 and the trace P2. The seed layer SE3 and the metal layer M3 of the bonding pad P1 and the trace P2 may be sequentially stacked on the carrier 36 and the dielectric layer 24a. After the conductive layer 26a is formed, the dielectric layer 24b may be formed on the conductive layer 26a and the dielectric layer 24a. Similarly, the redistribution layer 20 may be formed on the carrier 36. The manner of forming the redistribution layer 20 in the present invention is not limited to the mentioned above. The top view direction TD2 may be, for example, a normal direction perpendicular to an upper surface of the carrier 36.

It should be noted that, since the bonding pad P1 is disposed in the through hole TH1 and is connected to the trace P2 disposed on the first surface S1 of the dielectric layer 24a, the bonding pad P1 may have a thicker thickness than the trace P2. Accordingly, the bonding pad P1 is still able to be tightly fixed with the conductive terminal 22 after the conductive terminal 22 is bonded to the bonding pad P1. In such case, only one electroplating process is required to fabricate the bonding pad P1 and the trace P2, thereby reducing fabrication time and cost.

In this embodiment, the carrier 36 may have a release layer 38 disposed thereon, and the redistribution layer 20 is formed on the release layer 38, but not limited thereto. The carrier 36 may be used to support films or components formed thereon, and the carrier 36 may include, for example, glass, wafer substrate, metal, or other suitable supporting materials. The release layer 38 may be used to separate the carrier 36 from the components formed thereon (e.g., a semi-finished structure 1a shown in FIG. 8) after the subsequent steps are completed. A releasing manner of the release layer 38 may include, for example, photodissociation or other suitable manners. The release layer 38 may include, for example, polyethylene (PE), polyethylene terephthalate (PET), epoxy, oriented polypropylene (OPP) or other suitable materials, but not limited thereto.

Figure 6:
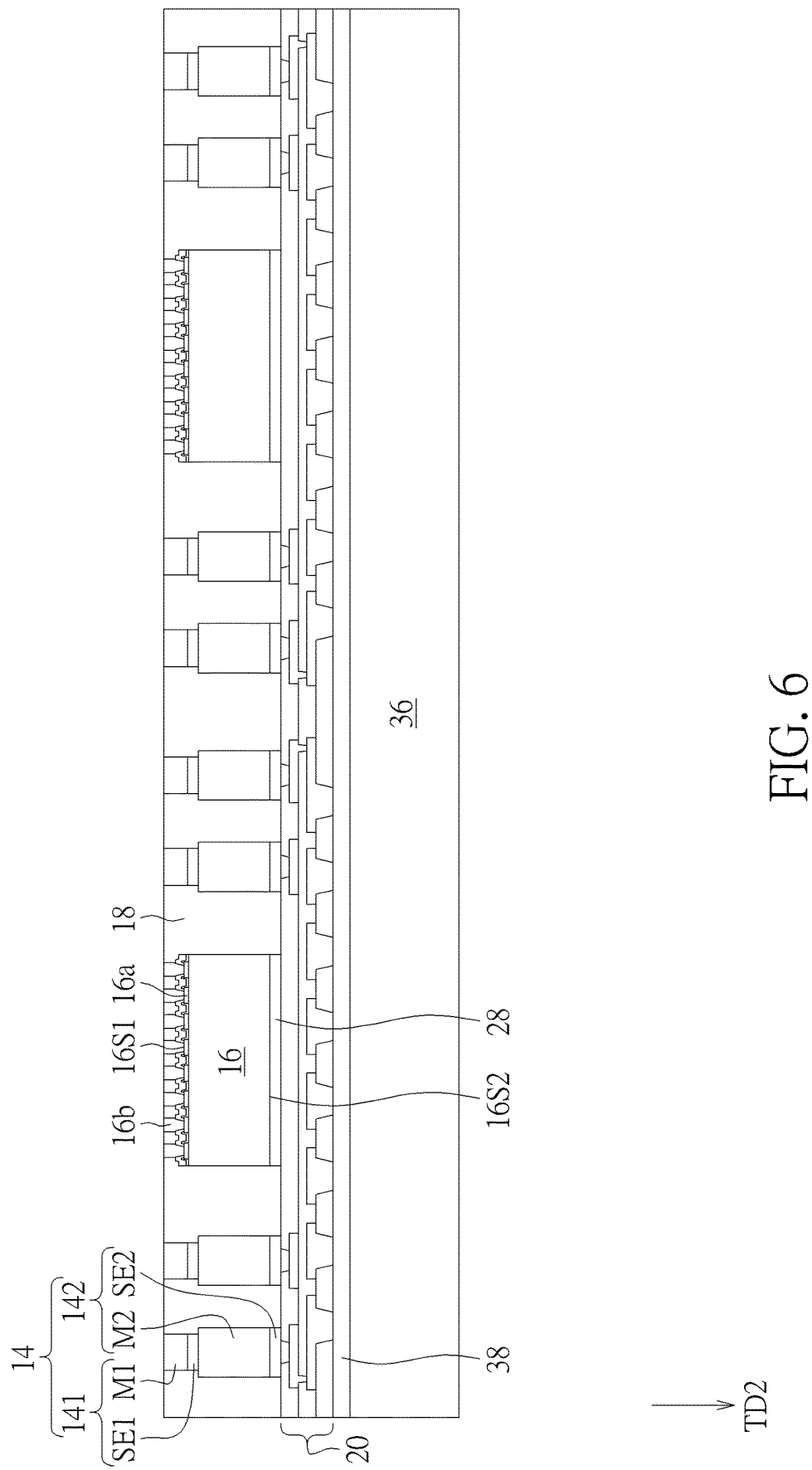

As shown in FIG. 6, in step S14, the conductive elements 14, the active chip 16 and the encapsulation layer 18 are formed on the redistribution layer 20. In this embodiment, the conductive elements 14, the active chip 16 and the encapsulation layer 18 may be formed on the redistribution layer 20 in sequence, and the specific forming method will be described in detail below, but not limited thereto.

Figure 5:
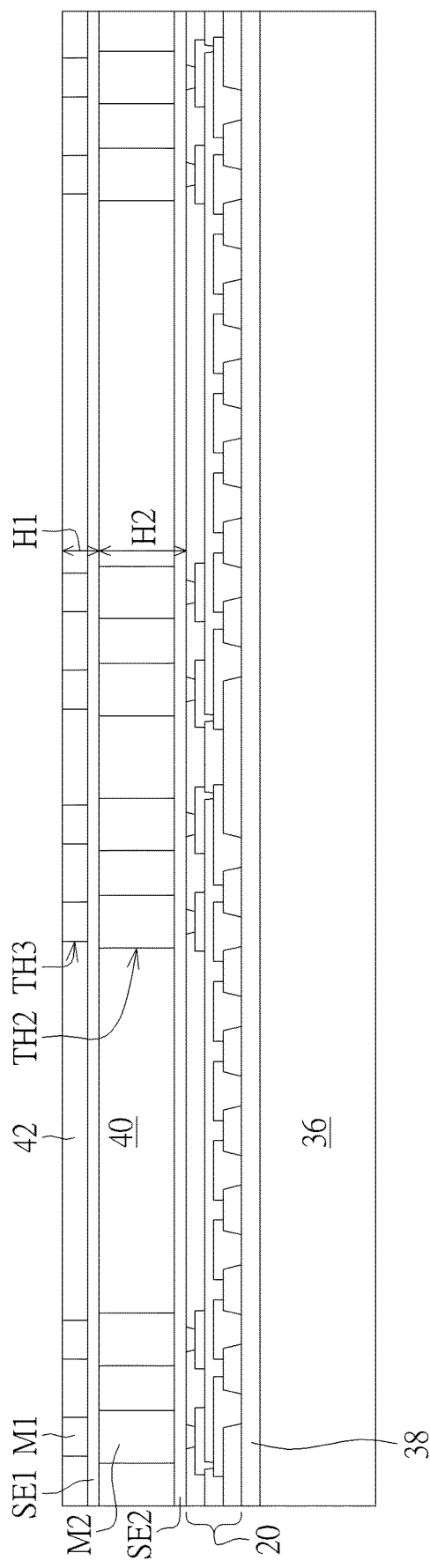

As shown in FIG. 4 and FIG. 5, each of the conductive elements 14 includes the conductive pillar 141 and the conductive pillar 142 as an example for illustration, but not limited thereto. First, a seed layer SE2 is formed on the redistribution layer 20, and then a patterned photoresist layer 40 is formed on the seed layer SE2, in which the patterned photoresist layer 40 may have through holes TH2. After that, a metal layer M2 is formed in the through holes TH2. A manner of forming the metal layer M2 may include, for example, a deposition process, an electroplating process, an electroless plating process or other suitable processes.

As shown in FIG. 5, a seed layer SE1 is optionally formed on the metal layer M2 and the patterned photoresist layer 40, and then a patterned photoresist layer 42 is formed on the seed layer SE1, in which the patterned photoresist layer 42 may have through holes TH3. Next, a metal layer M1 is formed in the through holes TH3. A manner of forming the metal layer M1 may be, for example, similar to or the same as the manner of forming the metal layer M2 and will not be described redundantly.

As shown in FIG. 6, subsequently, the patterned photoresist layer 42 and the seed layer SE1 not overlapping the metal layer M1 in the top view direction TD2 are sequentially removed, thereby forming the conductive pillar 141. Next, the patterned photoresist layer 40 and a portion of the seed layer SE2 without overlapping the metal layer M2 in the top view direction TD2 are sequentially removed to form the conductive pillar 142. In this way, the conductive elements 14 of this embodiment may be formed. In some embodiments, when one of the conductive elements 14 includes three or more layers of conductive pillars, the steps of forming the seed layer, the patterned photoresist layer and the metal layer may be repeated at least one time, and after the number of layers of conductive pillars reaches requirement, the patterned photoresist layer and a portion of the seed layer without overlapping the corresponding metal layer are then removed. Since the metal layer M1 and the metal layer M2 may be formed on the seed layer SE1 and the seed layer SE2 respectively, the quality of the conductive elements 14 can be improved.

In some embodiments, between the step of forming the metal layer M2 and the step of forming the patterned photoresist layer 42, the seed layer SE1 may not be formed, so that the patterned photoresist layer 42 may be directly formed on the patterned photoresist layer 40 and the metal layer M2, but not limited thereto. In such case, the step of removing the patterned photoresist layer 42 may simultaneously remove the patterned photoresist layer 40, thereby simplifying the step of forming the conductive elements 14. When the seed layer SE1 is formed before the metal layer M1 is formed, the metal layer M1 may have better quality, such as electrical properties, compactness, or surface flatness, compared to the case that the seed layer SE1 is not formed. For example, when the metal layer M1 is formed by the electroplating process, the seed layer SE1 may be used as an electrode for electroplating, so that the metal layer M1 may be directly formed on the seed layer SE1 with better flatness or electroplating quality.

As shown in FIG. 6, after the conductive elements 14 are formed, the active chip 16 may be disposed on the redistribution layer 20. In this embodiment, the active chip 16 is attached to the redistribution layer 20 through the adhesive layer 28 in a manner of the back surface 16S2 of the active chip 16 facing downward, but not limited thereto. In some embodiments, the active surface 16S1 of the active chip 16 may be disposed to face the redistribution layer 20 in a flip-chip bonding manner. It should be noted that, before disposing the active chip 16 on the redistribution layer 20, the conductive bumps 16b may be optionally formed on the bonding pads 16a of the active chip 16 to avoid damage to the bonding pads 16a in the subsequent steps. The number of the active chip 16 may be determined, for example, according to the number of the active chip in a single package structure 1 and/or the number of the package structure 1.

As shown in FIG. 6, after the active chip 16 is disposed, an encapsulation layer 18 may be formed on the conductive element 14, the active chip 16 and the redistribution layer 20, and then the encapsulation layer 18 may be thinned to expose the conductive element 14 and the conductive bumps 16b. Top surfaces of the encapsulation layer 18, the conductive elements 14 and the conductive bumps 16b may be thinned to the same plane, for example. A manner of thinning the encapsulation layer 18 may include, for example, a grinding process or other suitable processes.

Figure 7:
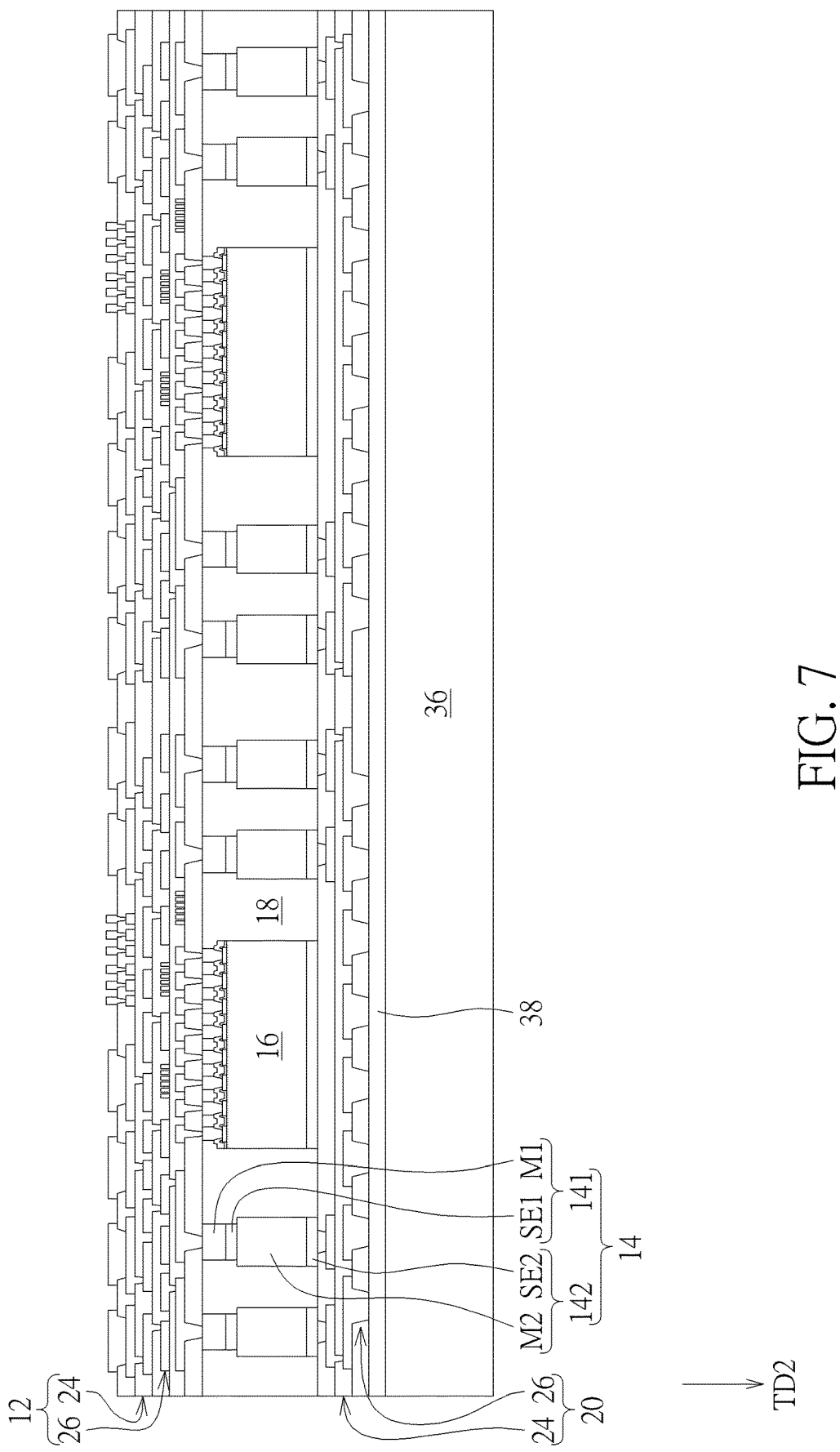

As shown in FIG. 7, after the encapsulation layer 18 is thinned, step S16 may be performed to form the redistribution layer 12 on the conductive elements 14, the active chip 16 and the encapsulation layer 18. A manner of forming the redistribution layer 12 may be similar to or the same as the manner of forming the redistribution layer 20 and will not be repeated herein. The number of the conductive layers 26 in the redistribution layer 12 and the number of the conductive layers 26 in the redistribution layer 20 may be the same or different. For example, since the redistribution layer 12 is disposed facing the active surface 16S1 of the active chip 16, the number of the conductive layers 26 of the redistribution layer 12 may be greater than the number of the conductive layers 26 of the redistribution layer 20, but not limited thereto.

Figure 8:
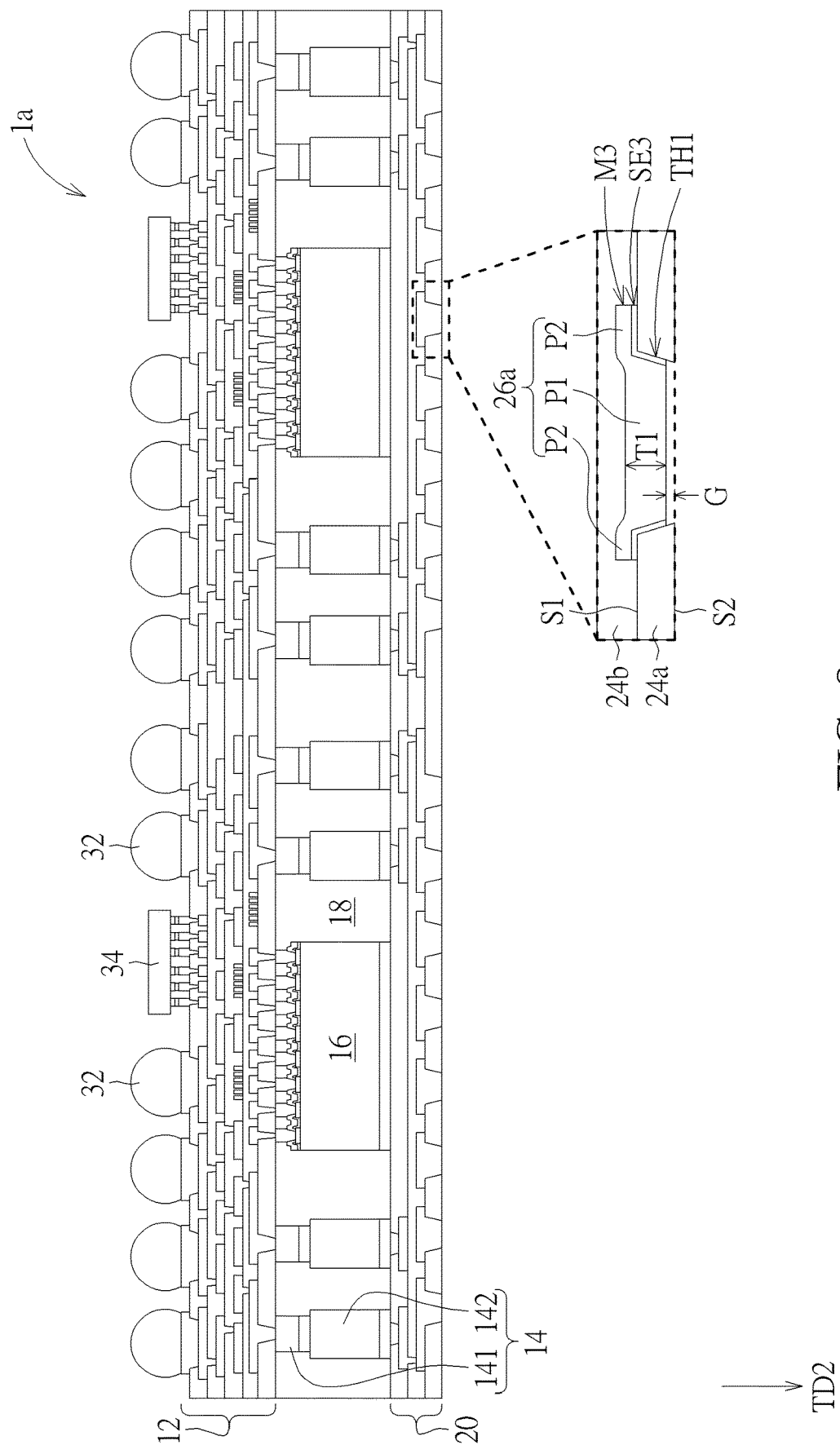

As shown in FIG. 8, after the redistribution layer 12 is formed, step S18 may be performed to remove the carrier 36 and the release layer 38 to expose the seed layer SE3 of each of the bonding pads P1. A manner of removing the carrier 36 may include, for example, irradiating the release layer 38 with light to reduce the adhesion of the release layer 38, thereby removing the carrier 36, but not limited thereto. Then, an exposed portion of the seed layer SE3 may be removed to expose the metal layer M3. In this way, a gap G may be formed between the plane of the second surface S2 of the dielectric layer 24a and the plane of the surface of the bonding pad P1 away from the active chip 16 to facilitate the anchoring of the conductive terminals 22 formed subsequently. A manner of removing the portion of the seed layer SE3 may include, for example, a wet etching process or other suitable manners. The wet etching process may, for example, help to clean an exposed surface of the metal layer M3 to reduce oxidation, so as to facilitate electrical connection and bonding of the metal layer M3 with the conductive terminals 22 formed subsequently.

It should be noted that, since the height of the gap G will affect the thickness T1 of one of the bonding pads P1 in the top view direction TD2, at least a portion of the exposed seed layer SE3 may be optionally removed. Specifically, the seed layer SE3 may, for example, include a first material layer and a second material layer sequentially stacked on the metal layer M3 or be formed of the first material layer and the second material layer, wherein the first material layer may be in contact with the metal layer M3 and located between the second material layer and the metal layer M3. The first material layer may include the same material as the metal layer M3, such as copper, or be formed of copper, and the second material layer may include a material different from the metal layer M3, such as including titanium or being formed of titanium. While forming the gap G, only the second material layer different from the metal layer M3 may be removed to expose the first material layer that has a better bonding with the conductive terminals 22. Alternatively, while forming the gap G, the second material layer and at least a portion of the first material layer may be removed, or the seed layer SE3 and a portion of the metal layer M3 may be removed. In some embodiments, a thickness of the second material layer may be, for example, 0.1 μm, and a thickness of the first material layer may be, for example, 0.2 μm, but not limited thereto. Therefore, the height of the gap G may be, for example, greater than or equal to 0.1 μm, preferably 0.3 μm to 3 μm. The thickness T1 of one of the bonding pads P1 in the top view direction TD2 may be, for example, greater than or equal to 6 μm. In such situation, the thickness T1 of one of the bonding pads P1 can be thicker than the conventional bonding pad, thereby improving the bonding reliability between the bonding pad P1 and the conductive terminal 22.

In this embodiment, after removing the portion of the seed layer SE3, the conductive terminals 32 may be disposed on the redistribution layer 12 to facilitate the coupling and bonding of the package structure 1 with other components, thereby forming the semi-finished structure 1a, but not limited thereto. In some embodiments, after the redistribution layer 12 is formed, the electronic component 34 may optionally be disposed on the side of the redistribution layer 12 away from the active chip 16. The electronic component 34 may be electrically connected to the redistribution layer 12, for example, through the flip-chip bonding or other suitable manners. In some embodiments, after the electronic component 34 is disposed, an underfill layer (not shown) may optionally be disposed between the electronic component 34 and the redistribution layer 12 to strengthen the bonding between the electronic component 34 and the redistribution layer 12. The underfill layer may include, for example, capillary underfill (CUF) or other suitable filling materials. The underfill layer may be formed by, for example, a dispensing process. In some embodiments, the step of removing the carrier 36 and the release layer 38 and/or the step of removing the portion of the seed layer SE3 may be performed before or after disposing the conductive terminal 32 and/or the electronic component 34, but not limited thereto.

Figure 9:
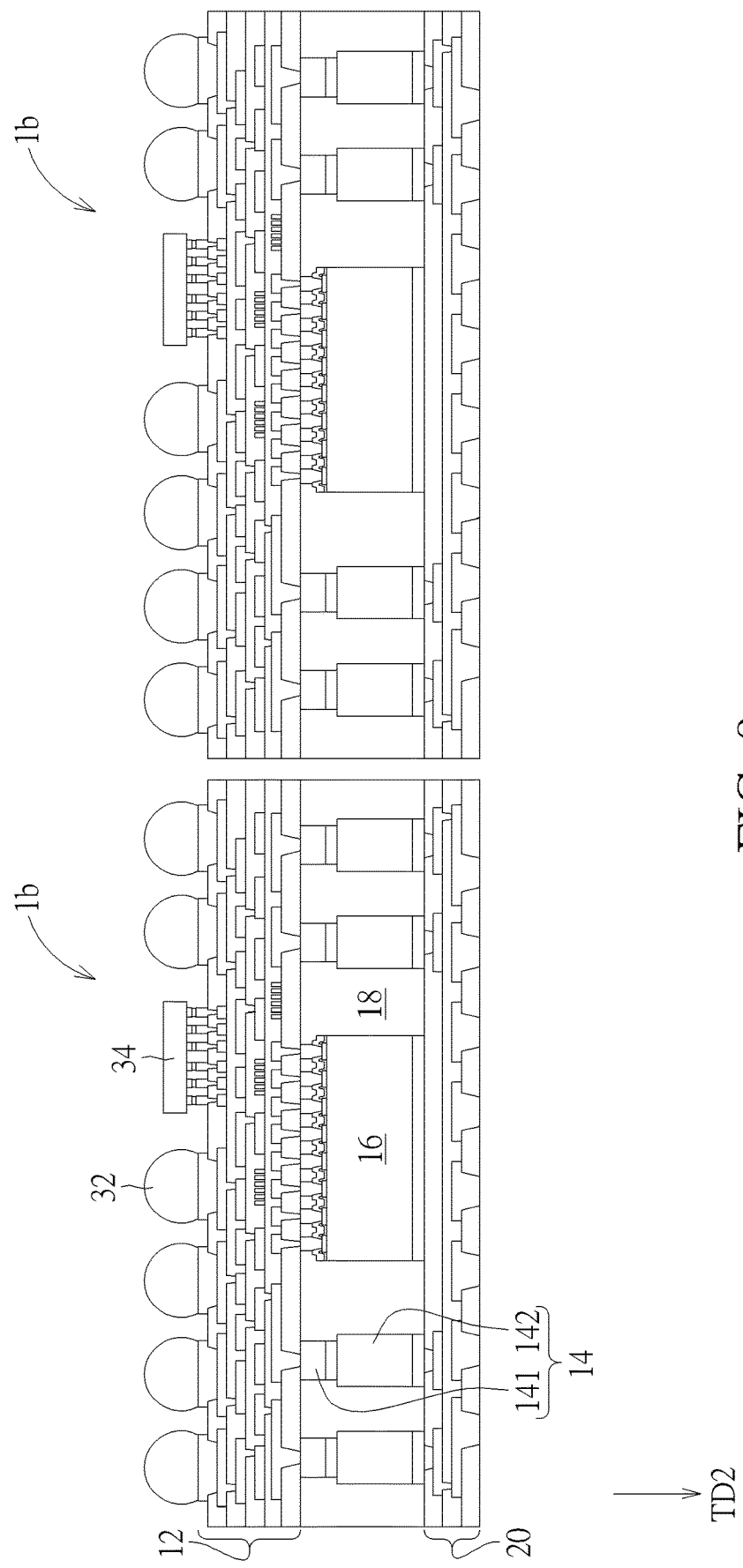

As shown in FIG. 9, after the semi-finished structure 1a is formed, a singulation process may be optionally performed to form at least one package structure 1b. The singulation process may, for example, include a dicing process or other suitable processes. In the embodiment of FIG. 8 and FIG. 9, since the semi-finished structure 1a includes at least two active chips 16, the singulation process may separate different active chips 16 from each other to form at least two package structures 1b, but not limited thereto. In some embodiments, when the semi-finished structure 1a is only used for a single package structure 1, the singulation process may not be required, but not limited thereto.

As shown in FIG. 1, after the package structure 1b is formed, step S110 may be performed to dispose the conductive terminals 22 on exposed surfaces of the bonding pads P1 of the package structure 1b (e.g., the surface of the metal layer M3), thereby forming the package structure 1 of the present embodiment. For example, the package structure 1b may be turned upside down first, such that the exposed surfaces of the bonding pads P1 face upward, and then the conductive terminals 22 are disposed on the bonding pads P1, respectively. Therefore, the top view direction TD1 shown in FIG. 1 may be opposite to the top view direction TD2 shown in FIG. 3 to FIG. 9. In some embodiments, the conductive terminals 22 may be disposed on the package component 30 first, and then the package component 30 and the conductive terminals 22 are disposed on the redistribution layer 20, but not limited thereto.

In summary, in the package structure of the present invention, the stacking structure of the multi-layer conductive pillars allows the stacking thickness of the conductive pillars to reach the thickness of the active chip, thereby solving the issue of the limited thickness of the active chip. In addition, since the thickness of one of the bonding pads may be greater than the thickness of the trace, the bonding reliability between one of the bonding pads and the corresponding conductive terminal may be improved. In addition, one of the conductive layers can be saved, so that the number of the conductive layers in the redistribution layer may be reduced, and/or the flatness of the surfaces of the bonding pads and traces close to the active chip and flatness of the surface of the dielectric layer may be improved, so as to increase the production efficiency of the redistribution layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
    a redistribution layer;
    a conductive element and an active chip disposed on the redistribution layer side by side;
    an encapsulation layer disposed on the redistribution layer, and the encapsulation layer surrounding the conductive element and the active chip;
    another redistribution layer disposed on the conductive element, the active chip and the encapsulation layer and electrically connected to the redistribution layer through the conductive element, wherein the another redistribution layer comprises a conductive layer, a dielectric layer, and another dielectric layer, the dielectric layer has a first surface close to the active chip and a second surface away from the active chip, the dielectric layer is disposed on the conductive layer and has a through hole, the conductive layer comprises a bonding pad disposed in the through hole, and a width of the through hole gradually increases from the second surface of the dielectric layer to the first surface of the dielectric layer, wherein the another dielectric layer is disposed between the dielectric layer and the active chip and between the bonding pad and the conductive element, the another dielectric layer and the dielectric layer are formed of a same material, and the another dielectric layer overlaps the bonding pad and the conductive element in a top view direction of the package structure; and
    a conductive terminal disposed on the bonding pad, and the conductive terminal contacting the bonding pad through the through hole.

2. The package structure as claimed in claim 1, wherein the conductive layer further comprises a trace disposed on the first surface of the dielectric layer, and a thickness of the bonding pad is greater than a thickness of the trace.

3. The package structure as claimed in claim 2, wherein the another dielectric layer is adjacent to the dielectric layer, and the trace is disposed between the another dielectric layer and a plane of a surface of the another dielectric layer contacting the dielectric layer.

4. The package structure as claimed in claim 1, wherein a gap is between a plane of the second surface of the dielectric layer and a plane of a top surface of the bonding pad in a top view direction of the package structure.

5. The package structure as claimed in claim 4, wherein a height of the gap is greater than or equal to 0.1 micrometers.

6. The package structure as claimed in claim 4, wherein the bonding pad comprises a metal layer and a seed layer, and the metal layer is separated from the dielectric layer by the seed layer.

7. The package structure as claimed in claim 6, wherein the metal layer directly contacts the conductive terminal.

8. The package structure as claimed in claim 1, wherein the conductive element comprises a conductive pillar and another conductive pillar sequentially stacked on the redistribution layer, a height of the conductive pillar is less than a height of the another conductive pillar, and a width of the conductive pillar is less than a width of the another conductive pillar.

9. The package structure as claimed in claim 8, wherein the conductive pillar comprises a metal layer.

10. The package structure as claimed in claim 8, wherein the active chip comprises a plurality of input/output pads and a plurality of conductive bumps, the conductive bumps are disposed on the input/output pads respectively, and a height of one of the conductive bumps is less than a height of the conductive pillar.

11. The package structure as claimed in claim 1, further comprising an adhesive layer disposed between the active chip and the another redistribution layer, and the active chip is attached on the another redistribution layer by the adhesive layer.

12. The package structure as claimed in claim 1, wherein a thickness of the active chip is greater than or equal to 200 micrometers.

13. The package structure as claimed in claim 1, further comprises an electronic component disposed on a side of the redistribution layer away from the active chip and electrically connected to the redistribution layer.

14. A manufacturing method of a package structure, comprising:
   forming a redistribution layer on a carrier, wherein the redistribution layer comprises a dielectric layer, a conductive layer, and another dielectric layer sequentially formed on the carrier, the dielectric layer has a first surface away from the carrier, a second surface close to the carrier, and a first through hole, the conductive layer comprises a bonding pad disposed in the first through hole, and a width of the first through hole gradually increases from the second surface of the dielectric layer to the first surface of the dielectric layer;
   forming a conductive element, an active chip, and an encapsulation layer on the redistribution layer, wherein the encapsulation layer surrounds the conductive element and the active chip, wherein the another dielectric layer is disposed between the dielectric layer and the active chip and between the bonding pad and the conductive element, the another dielectric layer and the dielectric layer are formed of a same material, and the another dielectric layer overlaps the bonding pad and the conductive element in a top view direction of the package structure;
   forming another redistribution layer on the conductive element, the active chip, and the encapsulation layer;
   removing the carrier to expose the bonding pad; and
   disposing a conductive terminal on an exposed surface of the bonding pad, wherein the conductive terminal contacts the bonding pad through the first through hole.

15. The manufacturing method of the package structure as claimed in claim 14, wherein the bonding pad comprises a seed layer and a metal layer sequentially stacked on the carrier and the dielectric layer, the manufacturing method further comprises removing a portion of the seed layer to expose the metal layer after the carrier is removed, and the conductive terminal contacts the metal layer of the bonding pad.

16. The manufacturing method of the package structure as claimed in claim 15, wherein a gap is between a plane of the second surface of the dielectric layer and a plane of a top surface of the bonding pad in a top view direction of the package structure.

17. The manufacturing method of the package structure as claimed in claim 14, wherein forming the conductive element comprises:
   forming a seed layer on the redistribution layer;
   forming a first patterned photoresist layer on the seed layer, wherein the first patterned photoresist layer has a second through hole;
   forming a metal layer in the second through hole;
   forming a second patterned photoresist layer on the first patterned photoresist layer and the metal layer, wherein the second patterned photoresist layer has a third through hole;
   forming another metal layer in the third through hole; and
   removing the second patterned photoresist layer, the first patterned photoresist layer and a portion of the seed layer without overlapping the metal layer to form a conductive pillar and another conductive pillar sequentially stacked on the redistribution layer.

18. The manufacturing method of the package structure as claimed in claim 17, wherein a height of the conductive pillar is greater than a height of the another conductive pillar, and a width of the conductive pillar is greater than a width of the another conductive pillar.

19. The manufacturing method of the package structure as claimed in claim 14, wherein the conductive layer further comprises a trace disposed on the first surface of the dielectric layer, and a thickness of the bonding pad is greater than a thickness of the trace.

20. The manufacturing method of the package structure as claimed in claim 14, wherein the manufacturing method further comprises disposing an electronic component on a side of the another redistribution layer away from the active chip after the another redistribution layer is formed, and the electronic component is electrically connected to the another redistribution layer.

* * * * *